(12) United States Patent
Kaizuka

(10) Patent No.: US 7,151,399 B2
(45) Date of Patent: Dec. 19, 2006

(54) SYSTEM AND METHOD FOR GENERATING MULTIPLE CLOCK SIGNALS

(75) Inventor: Masao Kaizuka, San Jose, CA (US)

(73) Assignee: Toshiba America Electronic Components, Inc., Irvine, CA (US)

( * ) Notice: Subject to any disclaimer, the term of this patent is extended or adjusted under 35 U.S.C. 154(b) by 15 days.

(21) Appl. No.: 11/049,442

(22) Filed: Feb. 2, 2005

(65) Prior Publication Data

US 2005/0248380 A1 Nov. 10, 2005

Related U.S. Application Data

(60) Provisional application No. 60/541,455, filed on Feb. 2, 2004.

(51) Int. Cl.
    *H03M 1/12* (2006.01)
(52) U.S. Cl. ............... 327/295; 327/291; 327/156
(58) Field of Classification Search ............... 327/150, 327/147–148, 156–158, 113, 115, 291–295; 455/313
See application file for complete search history.

(56) References Cited

U.S. PATENT DOCUMENTS

| | | | |
|---|---|---|---|
| 4,063,173 A * | 12/1977 | Nelson et al. ............... 455/20 |
| 5,896,428 A * | 4/1999 | Yanagiuchi ............... 375/374 |
| 6,294,935 B1 * | 9/2001 | Ott ............... 327/150 |
| 6,600,912 B1 * | 7/2003 | Stepp et al. ............... 455/313 |
| 2002/0023239 A1 | 2/2002 | Nomura et al. |
| 2003/0229815 A1 | 12/2003 | Fujiwara et al. |

FOREIGN PATENT DOCUMENTS

| EP | 1 176 752 A2 | 1/2002 |
|---|---|---|
| JP | 2002108490 A | 4/2002 |

\* cited by examiner

*Primary Examiner*—Dinh T. Le
(74) *Attorney, Agent, or Firm*—Tucker Ellis & West LLP

(57) ABSTRACT

A technique for generating multiple clock signals using a frequency generator for generating a common clock signal. A first digital divider and multiplier receives the common clock signal and produces a first clock signal. A second digital divider and multiplier receives the common clock signal and produces a second clock signal, the second clock signal being at a different frequency than the first clock signal. A third digital divider and multiplier receives the common clock signal and produces a third clock signal, the third clock signal being at a different frequency than the first clock signal and the second clock signal. The common clock signal can be the greatest common measure of the first, second and third clock signals divided by a multiple of two.

11 Claims, 9 Drawing Sheets

| GCM | Power of 2 | Divisor | Common Frequency |
|---|---|---|---|
| 7,225,344,000 | 0 | 1 | 7,225,344,000 |
| 7,225,344,000 | 1 | 2 | 3,612,672,000 |
| 7,225,344,000 | 2 | 4 | 1,806,336,000 |
| 7,225,344,000 | 3 | 8 | 903,168,000 |
| 7,225,344,000 | 4 | 16 | 451,584,000 |
| 7,225,344,000 | 5 | 32 | 225,792,000 |
| 7,225,344,000 | 6 | 64 | 112,896,000 |
| 7,225,344,000 | 7 | 128 | 56,448,000 |
| 7,225,344,000 | 8 | 256 | 28,224,000 |
| 7,225,344,000 | 9 | 512 | 14,112,000 |
| 7,225,344,000 | 10 | 1,024 | 7,056,000 |
| 7,225,344,000 | 11 | 2,048 | 3,528,000 |
| 7,225,344,000 | 12 | 4,096 | 1,764,000 |
| 7,225,344,000 | 13 | 8,192 | 882,000 |
| 7,225,344,000 | 14 | 16,384 | 441,000 |
| 7,225,344,000 | 15 | 32,768 | 220,500 |

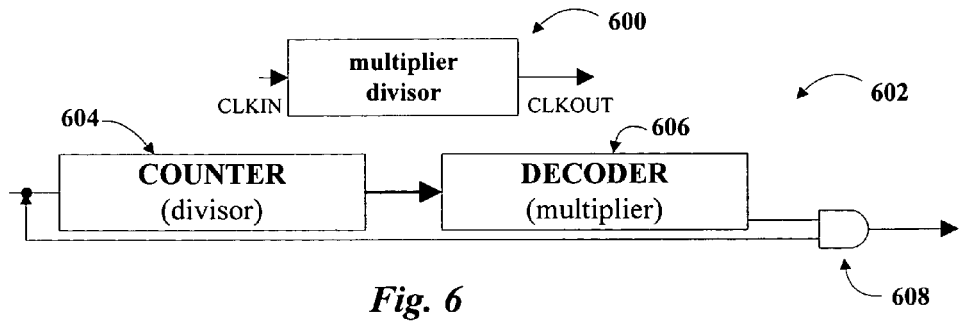
*Fig. 6*
| INPUT | OUTPUT |
|---|---|
| 0 | 1 |
| 1 | 0 |
| 2 | 0 |
| 3 | 0 |
| 4 | 0 |
| 5 | 1 |
| 6 | 0 |
| 7 | 0 |
| 8 | 0 |
| 9 | 0 |
| 10 | 0 |
| 11 | 1 |
| 12 | 0 |
| 13 | 0 |
| 14 | 0 |
| 15 | 0 |
| 16 | 0 |
| next 0 | 1 |
*Fig. 7*
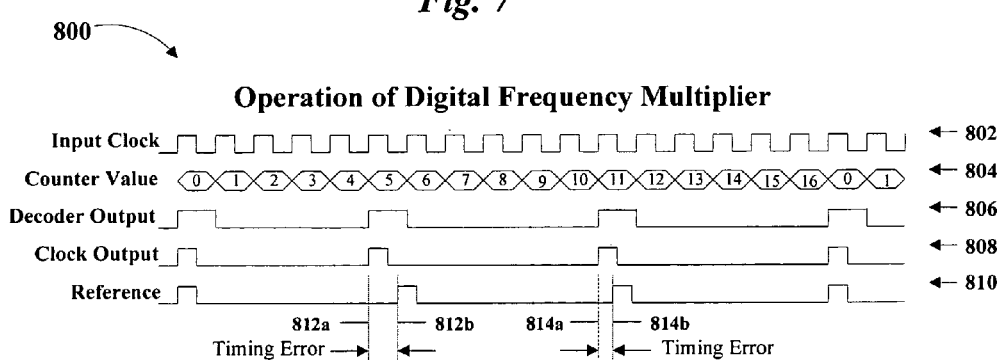
*Fig. 8*

SYSTEM AND METHOD FOR GENERATING MULTIPLE CLOCK SIGNALS

CROSS-REFERENCE TO RELATED APPLICATIONS

This application claims the benefit of priority of U.S. Provisional Application No. 60/541,455 filed Feb. 2, 2004.

BACKGROUND OF THE INVENTION

The present invention relates generally to communications systems, and more particularly to a system and method for generating a clock signal using a greatest common measure of sampling frequencies.

A coder/decoder ("codec") is considered to be any technology that encodes or decodes a signal. For example, telephone companies use codes to convert binary signals transmitted on their digital networks to analog signals converted on their analog networks. As used in the audio field, the audio codec requires a base clock signal for audio sampling. For example, common audio sampling frequencies typically range from 8 KHz to 96 KHz, with 44.1 KHz and 48 KHz listed among the common sampling range. In practical applications, real device frequencies are multiplied by 512 or 64 times the sampling frequency used.

Standard Universal Asynchronous Receiver Transmitter (UART) devices often used for asynchronous or other serial communications, can use a multiplier of 16 times the baud rate is required. The UART controller is often employed as a component of the serial communications subsystem of a computer. The UART takes bytes of data and transmits the individual bits in a sequential fashion. At the destination, a second UART re-assembles the bits into complete bytes.

FIG. 1 shows an example of various target clocks that can be required by a system on chip (SoC) that employs devices operating at audio sampling frequencies and UART device frequencies. Column 102 lists an exemplary purpose behind the frequency to be generated by the target clock listed in column 104, e.g., audio sampling rate or baud rate. As previously stated, the multiplying factors are typically 512 or 64 for audio sampling and 16 for baud rate. Column 106 lists the multiplier values corresponding to the respective target clock frequencies. The resultant output clock values in column 108 correspond to the multiplied target clock. Column 110 denotes whether the frequency in column 108 can be derived from another clock frequency. As shown in FIG. 1, there are three clock frequencies that are not derived from the other frequencies, these are 49.152 MHz, 45.1584 MHz and 14.7456 MHz. It will be appreciated that the first two values commonly correspond to audio sampling frequencies, while the latter correlates to a serial communications rate. For example, 45.1584 MHz corresponds to a target clock frequency of 88.2 KHz. The remainder of the clock frequencies may be arrived at by dividing one of the three non-derivable frequencies.

A common method for generating three clock signals is by using of two phase-locked loop (PLL) circuits to produce the frequencies where one of the PLL's generates two frequencies by employing a frequency divider. A problem with using this approach is that the use of two phase-locked loop circuits uses more space than would a system using only one phase-locked loop circuit.

An alternative approach to generating all of the frequencies listed in FIG. 1 is the use of a single input frequency and a simple divider. However, such an input frequency would be the greatest common measure of the three non-derivable clocks, which for the example of FIG. 1 is 7,225,344,000 Hz (7.225344 GHz). It is often desirable to use lower speed clocks because they are more readily available. Furthermore, lower speed clocks consume less power and generate less heat.

Thus there exists a need for a method and system to simplify the internal generation of a multiple clock signals. Furthermore, there exists the need to minimize the space utilized by the clock generator.

BRIEF SUMMARY OF THE INVENTION

The various aspects of the present invention are concerned with the generation of multiple clock signals from a single clock source. The clock signals can be generated from a common clock signal that is the greatest common measure of the desired output clock signals. Alternatively, the common clock signal that is the greatest common measure of the desired output clock signals divided by a power of two (e.g., $2^n$, where n is an integer greater than zero) can be used.

In accordance with an aspect of the present invention, there is disclosed herein a multi-level clock generating system, comprising a frequency generator for generating a common clock signal. A first digital divider and multiplier receives the common clock signal and produces a first clock output. A second digital divider and multiplier receives the common clock signal and produces a second clock output, wherein the second clock output is a different clock speed than the first clock output. A third digital divider and multiplier also receives the common clock signal and produces a third clock output. The third clock output can be at a different clock speed than the first clock output and the second clock output. Optionally, the common clock signal is at a frequency equal to a greatest common measure of the first clock output, the second clock output and the third clock output divided by a power of two. Furthermore, the first, second, and/or third digital divider and multiplier can comprise a counter used as a divider that receives the common clock signal, the output of the counter input into a decoder employed as a multiplier, and the output of the decoder input into an and gate which also receives the common clock signal.

In accordance with an aspect of the present invention, there is disclosed herein a method for generating multiple clock frequencies. The method comprises generating a common clock signal. The common clock signal is divided by a first divisor producing a first divided common clock signal that is multiplied by a first multiplicand producing a first clock signal. The common clock signal is also divided by a second divisor producing a second divided common clock signal that is multiplied by a second multiplicand producing a second clock signal. Furthermore, the common clock signal is divided by a third divisor producing a third divided common clock signal that is multiplied by a third multiplicand producing a third clock signal. The common clock signal is a greatest common measure of the first clock signal, second clock signal and third clock signal divided by a power of 2.

In accordance with an aspect of the present invention, there is disclosed herein a system for generating multiple clock signals. A means adapted for generating a common clock signal produces the common clock signal. A means responsive to the means for generating is adapted for generating a first clock signal by dividing the common clock signal by a first divisor producing a first divided signal and multiplying the first divided signal by a first multiplicand. A means responsive to the means for generating is adapted for generating a second clock signal by dividing the common clock signal by a second divisor producing a second divided signal and multiplying the second divided signal by a second multiplicand, A means responsive to the means for generating is adapted for generating a third clock signal by dividing the common clock signal by a third divisor producing a third divided signal and multiplying the divided signal by a third multiplicand.

Still other objects of the present invention will become readily apparent to those skilled in this art from the following description wherein there is shown and described a preferred embodiment of this invention, simply by way of illustration of one of the best modes best suited for to carry out the invention. As it will be realized, the invention is capable of other different embodiments and its several details are capable of modifications in various obvious aspects all without from the invention. Accordingly, the drawing and descriptions will be regarded as illustrative in nature and not as restrictive.

BRIEF DESCRIPTION OF THE SEVERAL VIEWS OF THE DRAWING

The accompanying drawings incorporated in and forming a part of the specification, illustrates several aspects of the present invention, and together with the description serve to explain the principles of the invention.

FIG. 6 is a block diagram of a digital divider and multiplier in accordance with an aspect of the present invention.

FIG. 7 illustrates a exemplary output table of a decoder used in a divider and multiplier in accordance with an aspect of the present invention FIG. 8 is a signal diagram that illustrates the operation of an exemplary divider and multiplier in accordance with an aspect of the present invention.

DETAILED DESCRIPTION OF INVENTION

Throughout this description, the preferred embodiment and examples shown should be considered as exemplars, rather than limitations, of the present invention. Various aspects of the present invention are concerned with the generation of multiple clock signals. The multiple clock signals can be derived from a single clock source. The clock signals can be generated from a common clock signal that is the greatest common measure of the desired output clock signals. Alternatively, the common clock signal that is the greatest common measure of the desired output clock signals divided by a power of two can be used.

Figure 1:
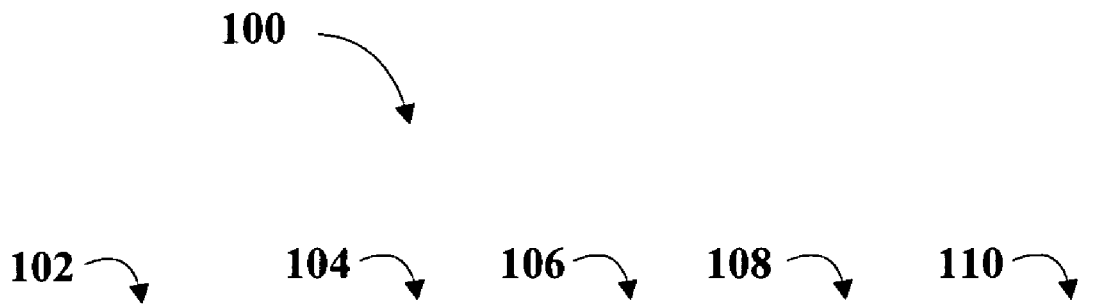
FIG. 1 is an exemplary table listing various target clock frequencies by a system on chip.

Referring to FIG. 1, there is shown an example of various target clocks for an exemplary system on chip (SoC) that employs devices operating at audio sampling frequencies and UART frequencies. As shown in FIG. 1, there are three clock frequencies that are not derived from the other frequencies, these are 49.152 MHz, 45.1584 MHz and 14.7456 MHz. These frequencies cannot be produced by dividing another frequency within the range of frequencies shown in FIG. 1. A single frequency that can be used to derive these three frequencies, the greatest common measure (GCM), can be calculated by multiplying the three non-derived frequencies together, which for the example of FIG. 1 is 7,225,344, 000 Hz (7.225344 GHz).

Figure 2:
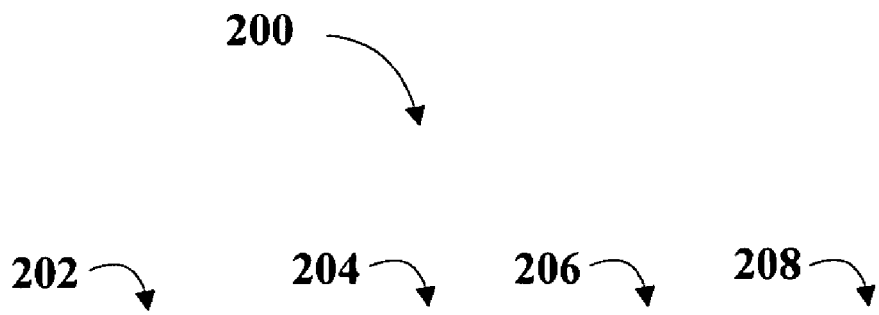
FIG. 2 is a block diagram of common clock frequencies that can be obtained by dividing a greatest common measure frequency by powers of two in accordance with an aspect of the present invention.

Referring to FIG. 2, there is a table 200 showing the greatest common measure used in FIG. 1, divided by various powers of two. Column 202, GCM, shows the greatest common measurement from the example of FIG. 1, i.e., 7.225344 GHz. Column 204 shows the power of 2 ($2^N$, where N is an integer greater than 0) of the divisor listed in column 206. The divisor in 206 was divided into the GCM in column 202 to obtain the common frequency shown in column 208. For example, the GCM, 7.225344 GHz divided by 2 to the 5th power (32) yields a common frequency of 225.792 MHz. Using lower frequencies can reduce costs be enabling cheaper components to be used and can save power.

Figure 3:
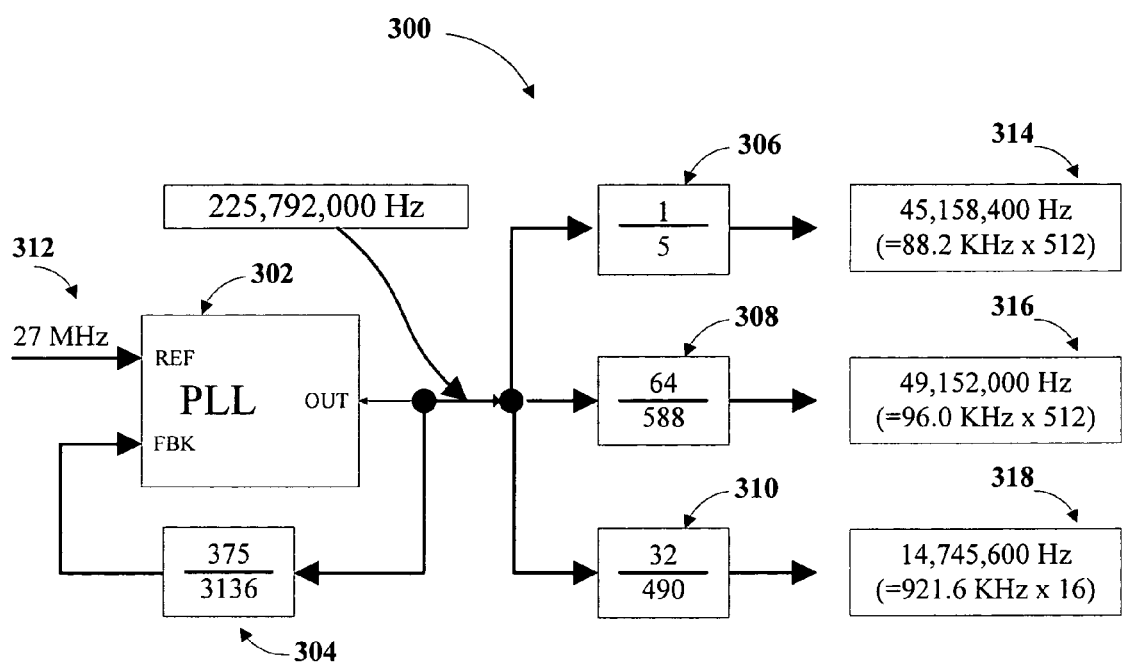
FIG. 3 is a block diagram of a system in accordance with an aspect of the present invention.

Referring to FIG. 3, there is illustrated a block diagram of a system 300 in accordance with an aspect of the present invention. The system 300 comprising a single phase-locked loop 302, a digital divider and multiplier 304, a first digital divider and multiplier 306, a second digital divider and multiplier 308 and a third digital divider and multiplier 310.

A frequency generator, comprising input signal 312, phase-locked loop 302 and digital divider and multiplier 304 generates a common clock signal. Phase-locked loop 302 receives the input signal 312 and functions as a multiplier of the input signal 312 to produce the common clock signal. A first digital divider and multiplier 306 receives the common clock signal and produces a first clock output. A second digital divider and multiplier 308 receives the common clock signal and produces a second clock output. The third digital divider and multiplier 310 receives the common clock signal and produces a third clock output. The second clock output can be at a different clock speed than the first clock output, and the third clock output can be different than both the first and second clock outputs. The common clock signal is a frequency equal to a greatest common measure of the first clock output, the second clock output and the third clock output divided by a power of two.

For example, an input frequency 312, e.g., 27 MHz, can be used as the reference for the phase-locked loop 302. The 27 MHz signal can be generated by an internal or external oscillator. Phase-locked loop 302 generates a common frequency derived from the greatest common measure of all clock frequencies. For example, clock frequencies of 88.2 KHz, 96.0 KHz and 921.6 KHz have a greatest common measure frequency of 7.225344 GHz. A common frequency of 225,792,000 Hz (225.792 MHz) can be derived by dividing the greatest common measure frequency by two raised to the 5th power (32). The common frequency is feed back into the phase-locked loop 302 via digital divider and multiplier 304. In the present example, the feedback digital divider and multiplier 304 would divide by 3136 and multiply by 375 to obtain the input frequency of 27 MHz. The greatest common measure is also sent to digital divider and multiplier 306, digital divider and multiplier 308 and digital divider and multiplier 310.

Digital multiplier and divider 306 divides the common frequency by 5 and multiplies by one to obtain the first clock frequency, 45.1584 MHz, which is is equivalent to the sampling frequency 88.2 KHz times the frequency multiple 512 a common audio frequency, as shown in block 314. Because the numerator is one in this example, a frequency divider can be employed instead of a digital divider and multiplier. A frequency divider can be employed whenever the numerator for a digital divider and multiplier is one. Digital multiplier and divider 308 divides the common frequency by 588 and multiplies the it by 64 to obtain the desired audio output frequency of 49.152 MHz, or 96.0 KHz times 512, another common audio sampling rate as shown in box 316. Digital multiplier and divider 310 divides the common frequency by 490 and multiplies it by 32 to obtain the output frequency of 14.7456 KHz, or 921.6 KHz times 16 which is a common serial communication clock speed.

The skilled artisan will appreciate that the numerators depicted in 306, 308 and 310 of FIG. 3 are powers of 2. The use of any power of 2 in the multiplier can have the effect of reducing the jitter, or skew, associated with frequency generation. Jitter occurs when samples are taken near to but not exactly at the desired sample locations. Furthermore, in order to reduce jitter, the common frequency should be greater than the highest clock output frequency. For example in FIG. 3 the highest clock frequency is 49.152 MHz, so the common frequency should be higher 49.152 MHz. Jitter can be introduced into the output clock when the fraction used for multiplying and dividing the common frequency is greater than one.

Figure 4:
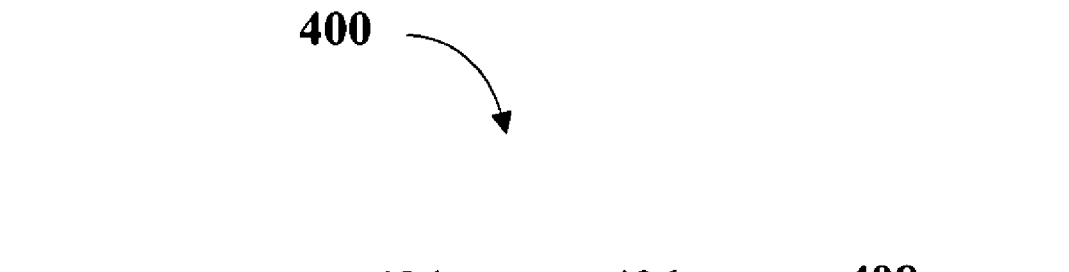
FIG. 4 is a table illustrating various frequency combinations and their associated greatest common measure frequency.

FIG. 4 is a table 400 illustrating various frequency combinations and their associated greatest common measure frequency. Column 402 is for frequencies that can be derived from 96.0 KHz, a common audio sampling frequency. Column 404 has frequencies derived from 88.2 KHz, another common audio sampling frequency. Column 406 lists common baud rates used for serial communications. Column 408 lists a greatest common measure (GCM) of the combination of frequencies corresponding to columns 402, 404 and 406. For example, using 96.0 KHz, 88.2 KHz and 921.6 KHz, the corresponding GCM is 225,792 KHz.

Figure 5:
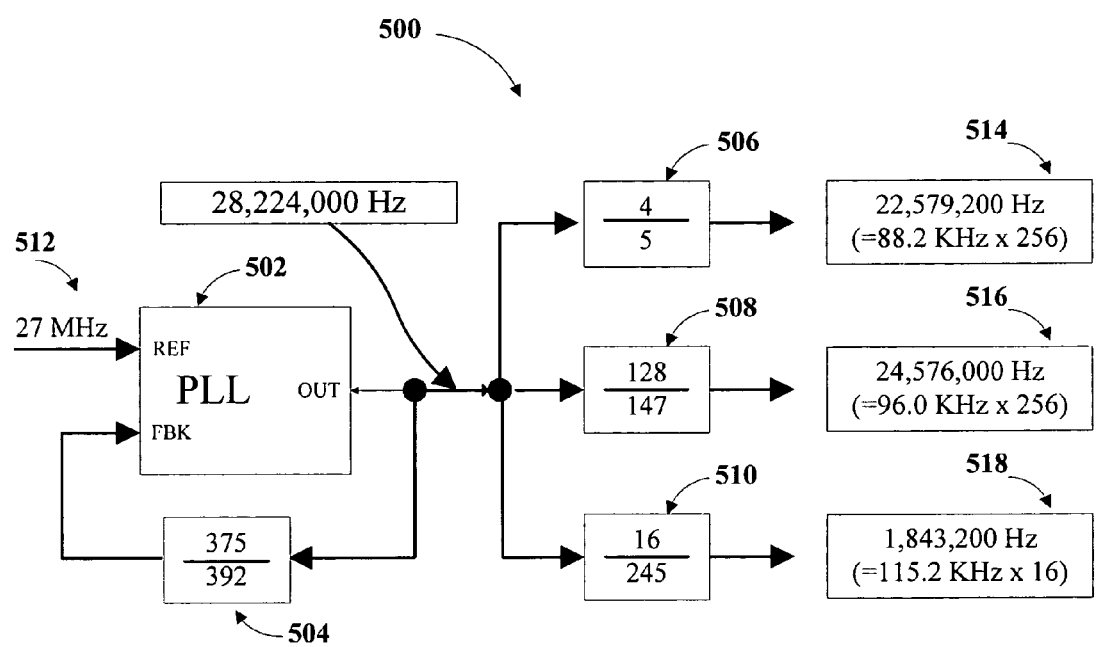
FIG. 5 is a block diagram of a system in accordance with an alternate embodiment of the present invention.

FIG. 5 is a block diagram of a system 500 in accordance with an alternate embodiment of the present invention. The desired clock outputs are 22.579 MHz (88.2 KHz×256) as shown at 514, 24.576 MHz (96.0 KHz×256) as shown at 516 and 1.8432 MHz (115.2 KHz×16) as shown at 518. These frequencies are lower is than the example frequencies used in FIG. 3 because the audio sampling rates are less (256 as opposed to 512) as is the serial communication rate (115.2 KHz as opposed to 921.6 KHz).

Referring to Table 400 (FIG. 4), the GCM for frequencies 96.0 KHz, 88.2 KHz and 115.2 KHz is 28.224 MHz, which doesn't factor in the sampling rates. However, 7.225344 GHz is also a GCM of the outputs after the sampling rates (256, 256 and 16 respectively) are factored in. Common clock frequency 28.224 MHz can be derived by dividing 7.225344 GHz by 256 ($2^8$), which is also greater than highest desired output frequency (24.576 MHz).

Phase-locked loop (PLL) 502 receives an input 512 of 27 MHz from an external clock source, e.g., an external oscillator. PLL 502 multiplies the input 512 and produces the common clock frequency, 28.224 MHz. The common clock frequency, 28.224 MHz is fed back to PLL 502 after passing through digital multiplier and divider 504, which divides the common clock frequency by 392 and multiplies it by 375.

Common clock frequency, 28.224 MHz is input into digital multiplier and divider 506, which divides the common clock frequency by 5 and multiplies it by 4 to obtain a 22.5792 MHz clock output. Common clock frequency, 28.224 MHz is input into digital multiplier and divider 508, which divides the common clock frequency by 147 and multiplies it by 128 to obtain a 24.576 MHz clock output. Common clock frequency, 28.224 MHz is input into digital multiplier and divider 510, which divides the common clock frequency by 245 and multiplies it by 16 to obtain a clock output of 1.8432 MHz.

It should be noted that in this example, in accordance with an aspect of the present invention, digital multiplier and dividers 506, 508 and 510 produce outputs 514, 516, 518 that are less than the common clock frequency 24.224 MHz. It should also be noted that as used in this example, in accordance with an aspect of the present invention, the numerators (multiplicands) of digital multiplier and dividers 506, 508 and 510 are all multiples of 2.

FIG. 6 is a block diagram of a digital divider and multiplier 600 in accordance with an aspect of the present invention. The digital divider and multiplier 600 is represented by a multiplier (multiplicand) in the numerator and a divisor in the denominator. A clock input signal (CLKIN) is thereby multiplied and divided, giving a clock output (CLKOUT) signal. An even more basic representation of digital divider and multiplier 600 may be viewed at 602. The divisor is represented by counter 604, and a multiplier is represented by decoder 606. Counter 604 counts the clock pulses and returns to zero when it reaches the value of the divisor. Decoder 606 receives the counter value and outputs a logical one for predetermined counter values corresponding to the multiplier. For example, if the multiplier is 2, then two counter values will output a logical one while the remaining counter values output a logical zero.

Clock input signal (CLKIN) is received by counter 604 which counts the received clock signals and counts CLKIN pulses, resetting when the number of CLKIN pulses reaches the value of the divisor. The output of counter 604 is input into decoder 606 which multiplies CLKIN by outputting a logical one for when the counter 604 outputs certain predetermined values. Preferably, the predetermined values are spaced as evenly as possible from each other to reduce timing errors such as jitter. The output of decoder 606 is input into And gate 608. The other input of And gate 608 receives CLKIN. The output of And gate 608 (CLKOUT) is a logical one when decoder 606 produces a logical one and CLKIN is also a logical one.

FIG. 7 illustrates a exemplary output table 700 of a decoder used in a divider and multiplier in accordance with an aspect of the present invention. As shown, the table shows 18 clock pulses received from CLKIN. As can be seen from column 702, the input from the counter is reset every 17 pulses (the counter counts from 0–16). The decoder outputs are shown in column 704. The decoder outputs a logical one when the counter value equals 0, 5 and 11, and zero otherwise. Therefore, because the counter resets every seventeen pulses it is dividing by 17, and since the decoder outputs a one three times during the 17 pulse cycle it is multiplying by one, thus the output is 3/17 the input.

FIG. 8 is a signal diagram 800 that illustrates the operation of an exemplary divider and multiplier in accordance with an aspect of the present invention. The example shown in FIG. 8 is for a 3/17 digital divider and multiplier, the counter and decoder outputs being similar as described with respect to FIG. 7 hereinabove, using a circuit as described in FIG. 6 hereinabove. The input clock 802 would be the equivalent to CLKIN as shown in FIG. 6. The counter value 804 would be the value at the output of counter 604 when dividing by 17. The counter counts 0 through 16 (17 pulses) and returns to 0. Decoder output 806 corresponds to the output of decoder 606, and produces three logical ones, and is thus multiplying by three. Clock Output 808 is the value of CLKOUT corresponding to the output of And gate 608. It should be noted that decoder 606 outputs a logical one for an entire clock cycle because counter 604 maintains the same output until the next clock cycle, whereas CLKOUT corresponds to the logic one part of a clock cycle because the decoder 606 output is logically anded with CLKIN by And gate 608. Reference 810 illustrates the timing of a true 3/17 division of CLKIN. Timing errors are illustrated by 812a, 812b and 814a, 814b.

It should be noted that using the circuit 600 as shown in FIG. 6, because decoder 606 bases its output on counter 604's output value, the multiplier value is less than the divisor value. In addition, the output pulse timing can have some error depending on the value of the multiplier and divisor. The timing error, as exemplified in FIG. 8, is deterministic and cyclic based on the divisor value, however the number of pulses is always accurate.

Figure 9:
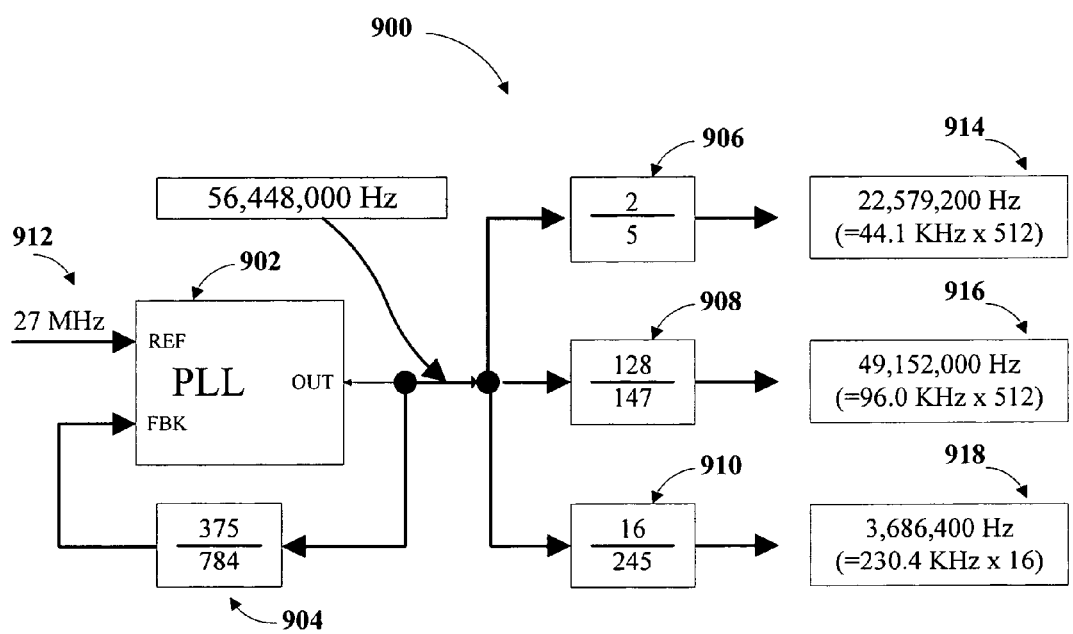
FIG. 9 is a block diagram of a system in accordance with an alternate embodiment of the present invention.

FIG. 9 is a block diagram of a system 900 in accordance with an alternate embodiment of the present invention. In this system 900, the desired clock frequencies are 22.5792 MHz (44.1 KHz×512) as shown at 914, 49.152 MHz (96.0 KHz×512) as shown at 916 and 3.6864 MHz (230.4 KHz× 16) as shown at 918. Of these three frequencies 914, 916, 918, the frequency at 916 49.152 MHz can not be derived from other clocks in table 100 (FIG. 1). Referring to Table 400 (FIG. 4), the lowest common frequency that can be used with these frequencies is 56.448 MHz, which is the GCM frequency, 7.225344 GHz divided by 128 ($2^7$). Using a lower frequency can reduce jitter and skew. Furthermore, lower frequencies can allow for cheaper components to be used and can save power. It should be noted that the common frequency, 56.448 MHz used in this example can be used to produce the outputs 314, 316, 318 of FIG. 3 by changing the values divisor and multipliers of divider and multipliers 306, 308, 318 to 4/5, 128/147 and 64/245 respectively.

Phase-locked loop (PLL) 902 receives an input 912 of 27 MHz from an external clock source, e.g., an external oscillator. PLL 902 multiplies the input 912 and produces the common clock frequency, 56.448 MHz. The common clock frequency, 56.448 MHz is fed back to PLL 902 after passing through digital multiplier and divider 904, which divides the common clock frequency by 784 and multiplies it by 375.

Common clock frequency, 56.448 MHz is input into digital multiplier and divider 906, which divides the common clock frequency by 5 and multiplies it by 2 to obtain a 22.5792 MHz clock output. Common clock frequency, 56.448 MHz is input into digital multiplier and divider 908, which divides the common clock frequency by 128 and multiplies it by 147 to obtain a 49.152 MHz clock output. Common clock frequency, 56.448 MHz is input into digital multiplier and divider 910, which divides the common clock frequency by 245 and multiplies it by 16 to obtain a clock output of 3.6864 MHz.

Figure 10:
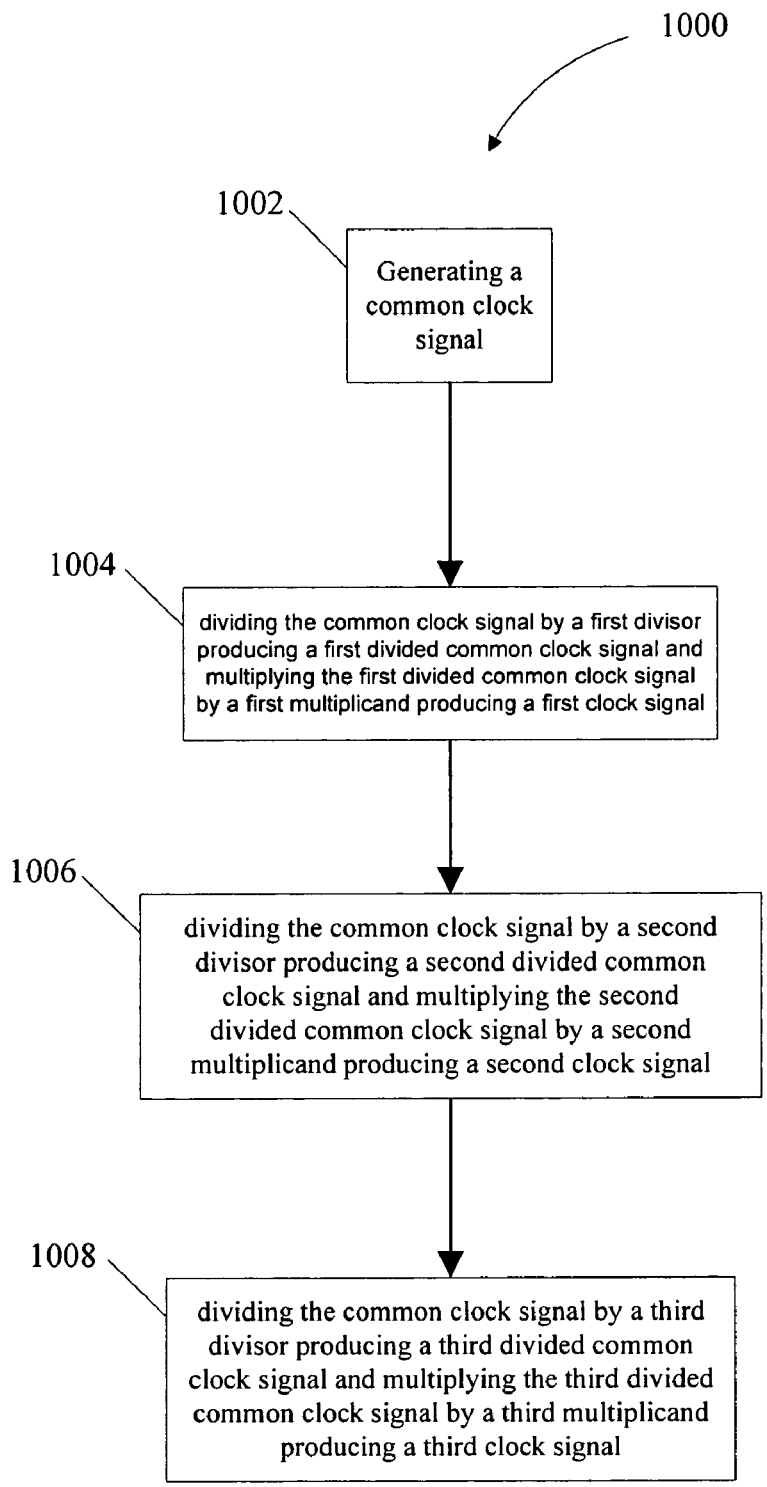
FIG. 10 is a block diagram of a method for generating multiple clock signals in accordance with an aspect of the present invention.
Figure 11:
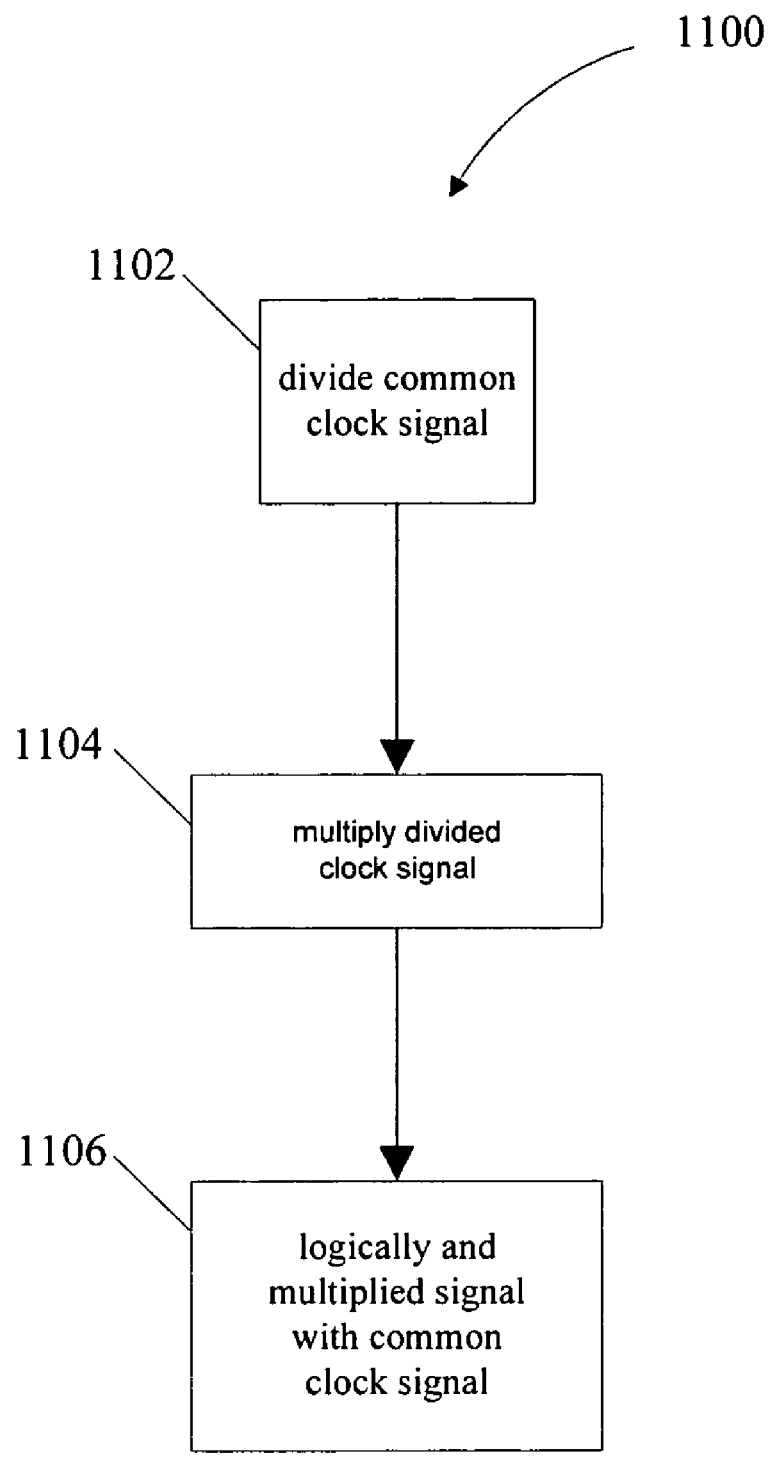
FIG. 11 is a block diagram of a method for converting clock speeds by dividing and multiplying in accordance with an aspect of the present invention.

In view of the foregoing structural and functional features described above, a methodologies in accordance with various aspects of the present invention will be better appreciated with reference to FIGS. 10 and 11. While, for purposes of simplicity of explanation, the methodologies of FIGS. 10 and 11 are shown and described as executing serially, it is to be understood and appreciated that the present invention is not limited by the illustrated order, as some aspects could, in accordance with the present invention, occur in different orders and/or concurrently with other aspects from that shown and described herein. Moreover, not all illustrated features may be required to implement a methodology in accordance with an aspect the present invention.

FIG. 10 is a block diagram of a method 1000 in accordance with an aspect of the present invention. The method can be used to generate a plurality of clock signals (as shown three, however more or less can be generated as desired). At 1002 a common clock signal is generated. The common clock signal can be the greatest common measure of the desired output clock speeds (frequencies) or can be a frequency that is the greatest common measure divided by a power of 2). The common clock signal can be generated by using an oscillator, or an oscillator in combination with a phase-locked loop. When using a phase-locked loop, the oscillator can be operating at a lower frequency than the common frequency.

At 1004 the common clock signal is divided by a first divisor. The division producing a first divided common clock signal. The first divided common clock signal is multiplied by a first multiplicand producing a first clock signal. At 1006 the common clock signal is divided by a second divisor. The division producing a second divided common clock signal. The second divided common clock signal is multiplied by a second multiplicand producing a second clock signal. At 1008 the common clock signal is divided by a third divisor. The division producing a third divided common clock signal. The third divided common clock signal is multiplied by a third multiplicand producing a third clock signal.

The division and multiplication performed at 1004, 1006, 1008 can be performed by a counter in series with a decoder. Alternatively, a frequency divider can be used to perform the division. For example, when the numerator for the multiplier is one, a frequency divider can be used along without a multiplier to obtain the desired output clock frequency. The first clock signal, second clock signal and third clock signal can have different frequencies. Additional clock outputs can be generated as desired. The common clock frequency can generated at 1002 can be a higher frequency than the clock outputs obtained at 1004, 1006 and 1008.

FIG. 11 is a block diagram of a method 1100 in accordance with an aspect of the present invention. Method 1100 converts one frequency to another and can be implemented by a digital multiplier and divider. Furthermore, method 1100 can be used with method 1000 of FIG. 10.

At 1102 a common clock signal is divided. This can be implemented by using a frequency divider or by using a counter. When using a counter, the number of cycles of the counter determine the divisor, e.g., when dividing by 5, a counter that cycles 0, 1, 2, 3, 4 can perform the division. At 1104 the divided clock signal can be multiplied. If the multiplicand is 1, then a frequency divider can be used at 1102 and 1104 can be skipped. If using a counter, a decoder can be used to perform the multiplication. For example, to obtain 2/5, a counter that counts to 4 (e.g., 0,1,2,3,4) can perform the division while a decoder that outputs a logical one during two of the counter's values (e.g. 0 and 2) performs the multiplication. The multiplier can either be a one or a multiple of two to reduce jitter and skew. At 1106 the multiplied signal (or if no multiplication is performed the divided signal) is logically and with the common clock signal. This produces an output pulse that has the same pulse width as the common clock signal.

When multiple frequencies are being produced (e.g., FIG. 10 which produces 3 output frequencies), a separate counter and decoder can be used to produce each frequency. The output from the decoder can be logically and with the common clock signal to produce the output. For example, when producing three outputs as shown in FIG. 10, the first decoder output is logically and with the common clock signal to produce the first clock output, the second decoder output is logically and with the common clock signal to produce the second clock output, and the third decoder output is logically and with the common clock signal to produce the third clock output. Additional clock outputs can be similarly generated as desired.

What has been described above includes exemplary implementations of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims interpreted in accordance with the breadth to which they are fairly, legally and equitably entitled.

What invention claimed is:

1. A multi-level clock generating system, comprising:
a first digital divider and multiplier for receiving a common clock signal and producing a first clock output, the first digital divider and multiplier comprises a first counter and a first decoder coupled in series with the first counter;
a second digital divider and multiplier for receiving the common clock signal and producing a second clock output, the second clock output being at a different frequency than the first clock output, the second digital divider and multiplier comprises a second counter and a second decoder coupled in series with the second counter; and
a third digital divider and multiplier for receiving the common clock signal and producing a third clock output, the third clock output being at a different frequency than the first clock output and the second clock output, the third digital divider and multiplier comprises a third counter and a third decoder coupled in series with the third counter.

2. The multi-level clock generating system of claim 1, wherein the common clock signal is a frequency equal to a greatest common measure of the first clock output, the second clock output and the third clock output divided by a power of two.

3. The multi-level clock generating system of claim 1, the further comprising: a phase-locked loop for receiving a signal and generating the common clock signal based on the received signal.

4. The multi-level clock generating system of claim 1, wherein the common clock signal is at a frequency greater than the first clock output, the second clock output, and the third clock output.

5. The multi-level clock generating system of claim 1, further comprising:
a first and gate having two inputs, the first input receiving the output from the first decoder and the second input receiving the common clock signal;
a second and gate having two inputs, the first input receiving the output from the second decoder and the second input receiving the common clock signal; and
a third and gate having two inputs, the first input receiving the output from the third decoder and the second input receiving the common clock signal.

6. A method for generating multiple clock frequencies, comprising:
generating a common clock signal;
dividing the common clock signal by a first divisor producing a first divided common clock signal and multiplying the first divided common clock signal by a first multiplicand producing a first clock signal;
dividing the common clock signal by a second divisor producing a second divided common clock signal and multiplying the second divided common clock signal by a second multiplicand producing a second clock signal; and
dividing the common clock signal by a third divisor producing a third divided common clock signal and multiplying the third divided common clock signal by a third multiplicand producing a third clock signal;
wherein the common clock signal is a greatest common measure of the first clock signal, second clock signal and third clock signal divided by a power of 2;
wherein the dividing the common clock signal by a first divisor producing a first divided common clock signal and multiplying the first divided common clock signal by a first multiplicand producing a first clock signal, comprises inputting the common clock signal into a first counter and inputting the first counter output into a first decoder;
wherein the dividing the common clock signal by a second divisor producing a second divided common clock signal and multiplying the second divided common clock signal by a second multiplicand producing a second clock signal, comprises inputting the common clock signal into a second counter and inputting the second counter output into a second decoder; and
wherein the dividing the common clock signal by a third divisor producing a third divided common clock signal and multiplying the third divided common clock signal by a third multiplicand producing a third clock signal, comprises inputting the common clock signal into a third counter and inputting the third counter output into a third decoder.

7. The method of claim 6, the generating further comprising:
obtaining a signal from an oscillator; and
multiplying the obtained signal using a phased locked loop to obtain the common clock signal.

8. The method of claim 6, wherein the oscillator signal is a frequency less than the common clock signal.

9. The method of claim 6, further comprising:
logically anding the first decoder output with the common clock signal;
logically anding the second decoder output with the second common clock signal; and
logically anding the third decoder output with the third common clock signal.

10. The method of claim 9, wherein the common clock signal is at a higher frequency than the first clock signal, second clock signal and third clock signal.

11. The method of claim 10, wherein:
the first multiplicand is selected from a group consisting of one and a multiple of two;
the second multiplicand is selected from a group consisting of one and a multiple of two; and
the third multiplicand is selected from a group consisting of one and a multiple of two.

* * * * *